(12) United States Patent
Imai et al.

(10) Patent No.: US 10,714,460 B2
(45) Date of Patent: Jul. 14, 2020

(54) LIGHT EMITTING DEVICE AND MANUFACTURING METHOD THEREOF

(71) Applicants: CITIZEN ELECTRONICS CO., LTD., Fujiyoshida-shi, Yamanashi (JP); CITIZEN WATCH CO., LTD., Tokyo (JP)

(72) Inventors: Sadato Imai, Yamanashi (JP); Masahide Watanabe, Fujiyoshida (JP); Hirohiko Ishii, Fujiyoshida (JP); Koki Hirasawa, Ootsuki (JP)

(73) Assignees: Citizen Electronics Co., Ltd., Yamanashi (JP); Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 15/577,620

(22) PCT Filed: Feb. 9, 2016

(86) PCT No.: PCT/JP2016/053831
§ 371 (c)(1),
(2) Date: Nov. 28, 2017

(87) PCT Pub. No.: WO2016/194404
PCT Pub. Date: Dec. 8, 2016

(65) Prior Publication Data
US 2018/0138160 A1    May 17, 2018

(30) Foreign Application Priority Data
May 29, 2015   (JP) .................................. 2015-110553

(51) Int. Cl.
*H01L 25/16*    (2006.01)
*H01L 25/075*   (2006.01)
(Continued)

(52) U.S. Cl.
CPC ........ *H01L 25/167* (2013.01); *H01L 25/0753* (2013.01); *H01L 33/507* (2013.01);
(Continued)

(58) Field of Classification Search
None
See application file for complete search history.

(56) References Cited

U.S. PATENT DOCUMENTS 7,642,704 B2   1/2010   Imai et al.
2004/0124429 A1*  7/2004  Stokes .................. H01L 33/508
                                                      257/98
(Continued)

FOREIGN PATENT DOCUMENTS

JP   2006005290 A   1/2006
JP   2006303122 A   11/2006
(Continued)

OTHER PUBLICATIONS

International Search Report and Written Opinion for International Application No. PCT/JP2016/053831, dated Mar. 8, 2016—6 Pages.
(Continued)

*Primary Examiner* — Herve-Louis Y Assouman
(74) *Attorney, Agent, or Firm* — RatnerPrestia

(57) ABSTRACT

A light-emitting device and a manufacturing method thereof are provided, which device yields light exhibiting an actual hue with a deviation reduced as much as possible from a designed hue value, the light being a mixture of light emitted from a plurality of light-emitting elements mounted densely and excited light from a phosphor contained in a resin sealing the light-emitting elements. The light-emitting device includes a board, a plurality of light-emitting elements mounted densely on the board, a first resin free from any phosphor, placed among the plurality of light-emitting elements, and a second resin containing a phosphor and
(Continued)

covering an exposed part of the plurality of light-emitting elements.

4 Claims, 12 Drawing Sheets

(51) Int. Cl.
    *H01L 33/50*          (2010.01)
    *H01L 33/54*          (2010.01)
    *H01L 33/52*          (2010.01)
    *H01L 33/62*          (2010.01)

(52) U.S. Cl.
    CPC ............ *H01L 33/54* (2013.01); *H01L 33/505* (2013.01); *H01L 33/52* (2013.01); *H01L 33/62* (2013.01); *H01L 2224/48091* (2013.01); *H01L 2224/48137* (2013.01); *H01L 2924/181* (2013.01); *H01L 2933/005* (2013.01); *H01L 2933/0033* (2013.01); *H01L 2933/0041* (2013.01)

(56) References Cited

U.S. PATENT DOCUMENTS

| | | | | |
|---|---|---|---|---|
| 2006/0170083 A1* | 8/2006 | Kim | ............... | H01L 33/62 257/666 |
| 2006/0284209 A1* | 12/2006 | Kim | ............... | H01L 33/58 257/100 |
| 2008/0290351 A1* | 11/2008 | Ajiki | ............... | H01L 25/0753 257/88 |
| 2010/0320479 A1* | 12/2010 | Minato | ............... | H01L 33/505 257/88 |
| 2010/0327733 A1* | 12/2010 | Shaikevitch | ............ | H01L 33/50 313/501 |
| 2013/0062633 A1* | 3/2013 | Demuynck | ......... | H01L 25/0753 257/88 |
| 2013/0207130 A1* | 8/2013 | Reiherzer | ........... | H01L 25/0753 257/88 |
| 2013/0285077 A1* | 10/2013 | Kojima | ............... | H01L 25/0753 257/88 |
| 2014/0151734 A1* | 6/2014 | Ito | ........... | H01L 33/58 257/98 |
| 2015/0207045 A1* | 7/2015 | Wada | ................... | H01L 33/505 257/88 |

FOREIGN PATENT DOCUMENTS

| | | |
|---|---|---|
| JP | 2010170945 A | 8/2010 |
| JP | 2012044048 A | 3/2012 |
| JP | 2012109478 A | 6/2012 |
| JP | 2013232484 A | 11/2013 |
| JP | 2014135526 A | 7/2014 |
| JP | 2015056552 A | 3/2015 |

OTHER PUBLICATIONS

Written Opinion of the International Searching Authority for International Application No. PCT/JP2016/053831, dated Mar. 8, 2016, 5 pages.

* cited by examiner

LIGHT EMITTING DEVICE AND MANUFACTURING METHOD THEREOF

CROSS REFERENCE TO RELATED APPLICATIONS

This is the U.S. National Phase application of PCT/JP2016/053831, filed Feb. 9, 2016, which claims priority to Japanese Patent Application No. 2015-110553, filed May 29, 2015, the disclosures of these applications being incorporated herein by reference in their entireties for all purposes.

TECHNICAL FIELD OF THE INVENTION

The present invention relates to a light-emitting device and a manufacturing method thereof.

BACKGROUND OF THE INVENTION

There are known COB (Chip On Board) light-emitting devices provided with light-emitting elements such as LED (light-emitting diode) elements mounted on a general purpose board such as a ceramic board and a metal board. In such light-emitting devices, LED elements emitting light such as blue light are sealed with a resin containing a phosphor, which is excited by the light from the LED elements to yield light to be mixed therewith to provide light such as white light according to an application.

For example, Patent Literature 1 describes a light-emitting diode provided with a heat dissipation support with high thermal conductivity having a mount surface for die bonding, a circuit board which is placed on the heat dissipation support and has not only a hole for exposing a region of the mount surface but also overhang regions overhanging the perimeter edges of the heat dissipation support, a light-emitting element mounted on the mount surface inside the hole, and a light-transmissive resin body for sealing the upper part of the light-emitting element, wherein through-holes electrically connected to the light-emitting element are formed in the perimeter edges of the overhang regions, which through-holes are provided with external connection electrodes on the upper and lower surfaces thereof.

Further, Patent Literature 2 describes an LED package provided with a cavity including a recessed region formed therein, a protruding heat slug (pedestal) attached to the cavity in such a way as to penetrate the bottom of the recessed region, a submount board mounted on the heat slag, a plurality of LED chips disposed on the submount board, a lead frame electrically connected to each of the LED chips, a phosphor layer embedding each of the LED chips, and a lens formed of a silicone resin filled in the recessed region.

When such light-emitting devices are manufactured, the phosphor dispersed in the resin is settled before the resin is cured, in order to, for example, reduce the variation of chromaticity. For example, Patent Literature 3 describes a production method of a light-emitting element package including the steps of forming a repellent agent pattern on a board, mounting an LED chip inside the repellent agent pattern on the board, applying a seal resin containing a phosphor kneaded therewith to the inside of the repellent agent pattern, and settling the phosphor in the seal resin in a windless condition.

PATENT LITERATURE

Patent Literature 1: Japanese Unexamined Patent Publication (Kokai) No. 2006-005290

Patent Literature 2: Japanese Unexamined Patent Publication (Kokai) No. 2010-170945

Patent Literature 3: Japanese Unexamined Patent Publication (Kokai) No. 2012-044048

SUMMARY OF INVENTION

When a light-emitting device is surmounted by an optical element, such as a lens, to condense emitted light, the emission region of the light-emitting device is desirably as small as possible in order to improve its light condensation property. However, when the emission region is to be achieved by using only one light-emitting element, a large element is necessarily used to secure desired light emission intensity, leading to disadvantages such as the elevation of manufacturing costs and non-uniform electrical current supply to the light-emitting element, which worsens the light emission efficiency of the element. Therefore, a solution for such problems may be to mount a plurality of light-emitting elements densely, to achieve a compact emission region while securing desired light emission intensity.

However, in regard to light-emitting devices provided with a plurality of light-emitting elements mounted on a board and sealed with a resin containing a phosphor, excited light from which is mixed with light from the light-emitting elements and yields a desired light such as white light, the actual hue of the emitted light may be different from a desired hue thereof. This is because the traveling distance of light in the phosphor layer varies depending on what surface of the light-emitting elements emits the light, owing to the presence of the phosphor also in portions of the seal resin which portions fill the space among the light-emitting elements, since the light-emitting elements are mounted at a certain extent of space among each other in order to prevent short. The traveling distance of light in the phosphor layer varies depending on the position and direction of the emission from the light-emitting elements, thereby causing the intensity variation of light having a color corresponding to the phosphor, resulting in difficulty in adjusting the actual hue of the emitted light to a designed hue value.

Therefore, an object of the present invention is to provide a light-emitting device and a manufacturing method thereof, which device yields light exhibiting an actual hue with a deviation reduced as much as possible from a designed hue value, the light being a mixture of light emitted from a plurality of light-emitting elements mounted densely and excited light from a phosphor contained in a resin sealing the light-emitting elements.

Provided is a light-emitting device including a board, a plurality of light-emitting elements mounted densely on the board, a first resin free from any phosphor, placed among the plurality of light-emitting elements, and a second resin containing a phosphor and covering an exposed part of the plurality of light-emitting elements.

Preferably, in the above light-emitting device, the plurality of light-emitting elements are mounted densely on the board so that a space between adjacent light-emitting elements is 5 µm or more and 50 µm or less. Preferably, the above light-emitting device further includes an optical element mounted on the board so as to cover the second resin.

Further, provided is a manufacturing method of a light-emitting device, including the steps of mounting a plurality of light-emitting elements densely on a board, placing a first resin free from any phosphor among the plurality of light-emitting elements, and covering, with a second resin containing a phosphor, an exposed part of the plurality of light-emitting elements.

Preferably, in the step of placing of the above manufacturing method, the first resin is injected laterally into a space among the plurality of light-emitting elements mounted on the board, to fill the space among the plurality of light-emitting elements with the first resin. Preferably, in the above manufacturing method, the first resin is a resin for adhering the plurality of light-emitting elements to the board in the step of mounting, and in the step of placing, the first resin is spilled out into a space among the plurality of light-emitting elements, to fill the space among the light-emitting elements with the first resin.

According to the above light-emitting device and manufacturing method thereof, it is possible to yield light exhibiting an actual hue with a deviation reduced as much as possible from a designed hue value, the light being a mixture of light emitted from a plurality of light-emitting elements mounted densely and excited light from a phosphor contained in a resin sealing the light-emitting elements.

DETAILED DESCRIPTION OF EMBODIMENTS OF THE INVENTION

Hereinafter, with reference to the accompanying drawings, a light-emitting device and a manufacturing method thereof will be explained in detail. However, it should be noted that the present invention is not limited to the drawings or the embodiments described below.

Figure 1:
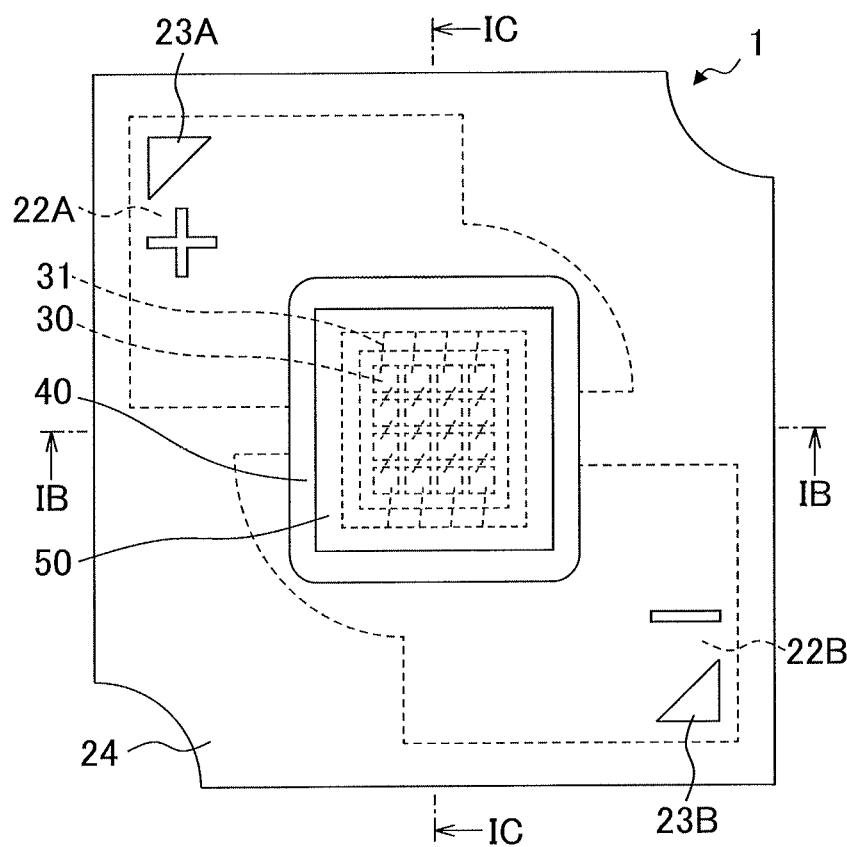
FIGS. 1(A) to (C) are a top view and cross-sectional views of a light-emitting device 1.
Figure 1:
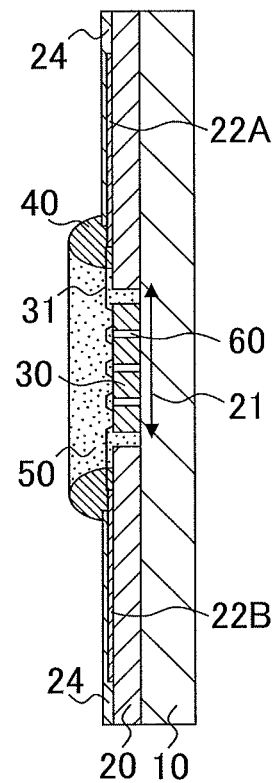
Figure 1:
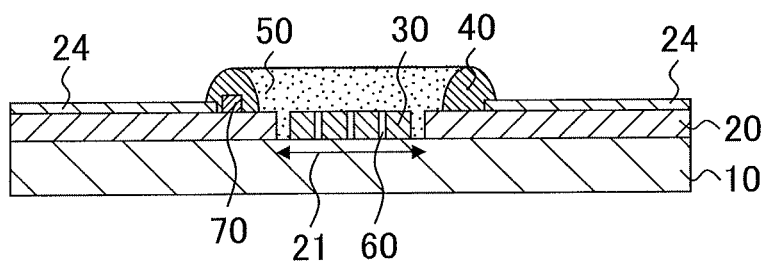

FIG. 1(A) to FIG. 1(C) are a top view and cross-sectional views of a light-emitting device 1. FIG. 1(A) is a top view of the light-emitting device 1 as a completed product, FIG. 1(B) is a cross-sectional view along the line IB-IB in FIG. 1(A), and FIG. 1(C) is a cross-sectional view along the line IC-IC in FIG. 1(A). The light-emitting device 1 includes LED elements as light-emitting elements, and is used for various illumination apparatuses such as LEDs for illumination and LED light bulbs. The light-emitting device 1 is provided with a mount board 10, a circuit board 20, LED elements 30, a resin frame 40, a seal resin 50, a transparent resin 60, and a Zener diode 70, as major components.

The mount board 10 is, for example, an almost square-shaped metal board, and includes, in the central region of the upper surface thereof, a mount region on which the LED element 30 are mounted. The mount board 10 is composed of, for example, aluminum excellent in thermal resistance and heat dissipativity, so that it also functions as a heat dissipation board for dissipating heat generated by the LED elements 30 and by a particulate phosphor described later. However, the material for the mount board 10 may be another metal such as copper, as long as it is excellent in thermal resistance and heat dissipativity.

Figure 5:
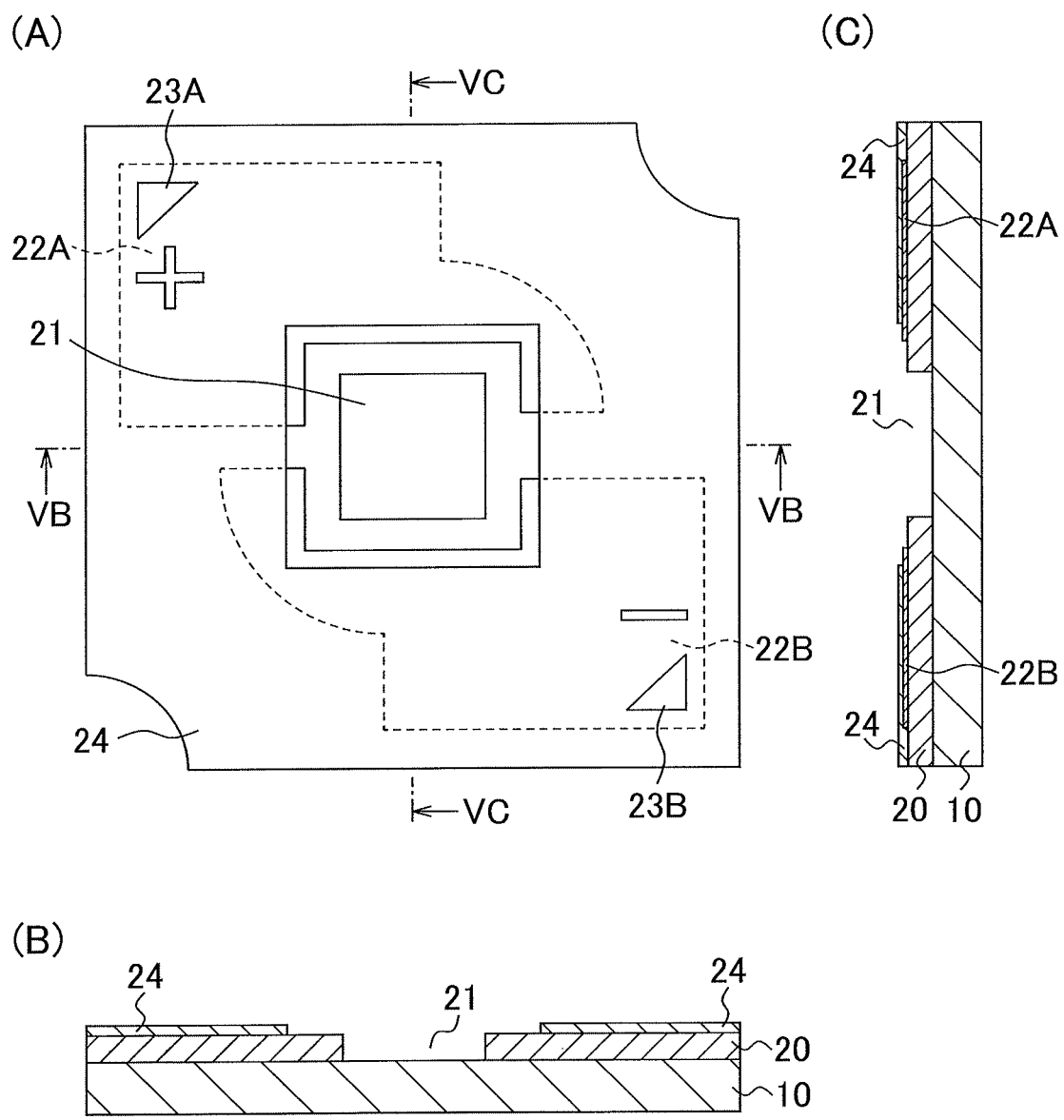
FIGS. 5(A) to (C) are a top view and cross-sectional views depicting a manufacturing step of the light-emitting device 1.
Figure 6:
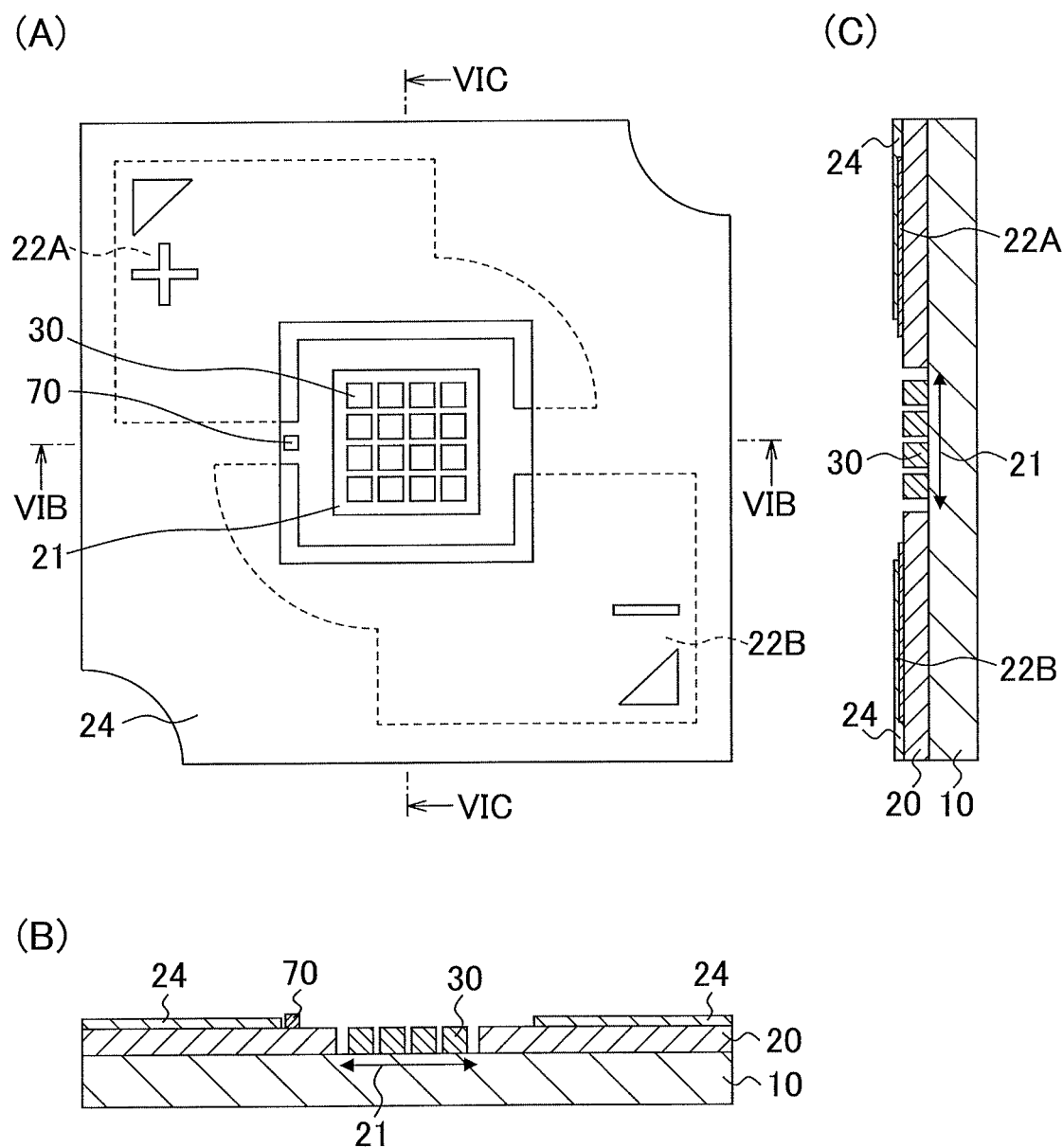
FIGS. 6(A) to (C) are a top view and cross-sectional views depicting a manufacturing step of the light-emitting device 1.

The circuit board 20 is, for example, of an almost square shape of the same size as that of the mount board 10, and provided with a rectangular opening 21 in its central region. The circuit board 20 is attached to and fixed on the mount board 10, for example, by an adhesion sheet on the lower surface of the circuit board. The circuit board 20 is provided with a conductive pattern 22A for a '+' electrode and a conductive pattern 22B for a '−' electrode, which are formed on the upper surface thereof. Further, the circuit board 20 is provided with connection electrodes 23A and 23B for connecting the light-emitting device 1 to an external power supply, which electrodes are formed at two corners located diagonally on the upper surface of the circuit board 20. The connection electrode 23A is the '+' electrode, and the connection electrode 23B is the '−' electrode, which are connected to and supplied with voltage from the external power supply, to drive the light-emitting device 1 to emit light. Still further, the circuit board 20 is provided with a white resist 24 which is formed on the upper surface thereof and covers the conductive patterns 22A and 22B except for the region on the surface neighboring and enclosing the perimeter of the opening 21 and the regions on the connection electrodes 23A and 23B (See FIG. 5(A) described later).

The LED elements 30 are an example of the light-emitting elements, and are, for example, blue LEDs which emit blue light having a wavelength band within the range from about 450 to 460 nm. In the light-emitting device 1, a plurality of LED elements 30 are mounted in a lattice-like arrangement on the central region of the mount board 10 exposed in the opening 21 of the circuit board 20. FIG. 1(A) illustrates, in particular, an example in which sixteen LED elements 30 are mounted. The lower surfaces of the LED elements 30 are fixed to the upper surface of the mount board 10, for example, by a transparent electrically insulative adhesive. The LED elements 30 are provided with a pair of element electrodes on the upper surface thereof, and the respective element electrodes of adjacent LED elements 30 are electrically connected to each other by wires 31 as depicted in FIG. 1(A). Wires 31 led out of outermost LED elements 30 located adjacent to the perimeter of the opening 21 are connected to the conductive patterns 22A and 22B of the circuit board 20. Thus, the respective LED elements 30 are supplied with electrical current via the wires 31.

The resin frame 40 is an almost rectangular frame body composed of, for example, a white resin and fitted to the size of the opening 21 of the circuit board 20, and it is fixed to a region on the upper surface of the circuit board 20, the region neighboring and enclosing the perimeter of the opening 21. The resin frame 40 is a dam member for preventing the outflow of the seal resin 50, and reflects light emitted laterally from the LED elements 30 in the upward direction with respect to the light-emitting device 1 (the direction opposite to the mount board 10 with respect to the LED elements 30).

In the light-emitting device 1, the mount region on the mount board 10, the opening 21 of the circuit board 20, and the resin frame 40 are rectangular, but these may have another shape such as a circular shape.

The seal resin 50 is an example of the second resin, which is injected into the opening 21, to cover the exposed parts of LED elements 30 (for example, the upper surfaces of the LED elements 30 and one of the side surfaces of the outermost LED elements 30, the side surface being adjacent to the side of the resin frame 40). Thus, the seal resin 50 covers and protects (seals) all of the LED elements 30 and the wires 31 together. For example, as the seal resin 50, a colorless and transparent resin such as silicone and epoxy resins, and in particular, a resin with thermal resistance of about 250° C. may be used.

The seal resin 50 contains a phosphor such as a yellow phosphor (phosphor 51 in FIG. 2 described later) mixed and dispersed therein. The yellow phosphor is a particulate phosphor material, such as YAG (yttrium aluminum garnet), which absorbs blue light emitted by the LED elements 30 and converts the wavelength thereof into that of yellow light. The light-emitting device 1 mixes blue light from the LED elements 30 which are blue LEDs and yellow light yielded through the excitation of the yellow phosphor, and emits the resultant white light.

Alternatively, the seal resin 50 may contain, for example, a plurality of phosphors such as green and red phosphors. The green phosphor is a particulate phosphor material such as $(BaSr)_2SiO_4:Eu^{2+}$, which absorbs blue light emitted by the LED elements 30 and converts the wavelength thereof into that of green light. The red phosphor is a particulate phosphor material, such as $CaAlSiN_3:Eu^{2+}$, which absorbs blue light emitted by the LED elements 30 and converts the wavelength thereof into that of red light. In this case, the light-emitting device 1 mixes blue light from the LED elements 30 which are blue LEDs and green and red lights yielded through the excitation of the green and red phosphors, respectively, and emits the resultant white light.

The transparent resin 60 is an example of the first resin, which is a colorless and transparent resin, such as silicone and epoxy resins, similar to the seal resin 50, but unlike the seal resin 50, it contains no phosphor. The transparent resin 60 is injected into the space among the LED elements 30 before the injection of the seal resin 50 into the opening 21, thereby filling the space among the LED elements 30. In other words, the transparent resin 60 fills the space from the lower to upper end of each LED element 30 among the LED elements 30.

Figure 7:
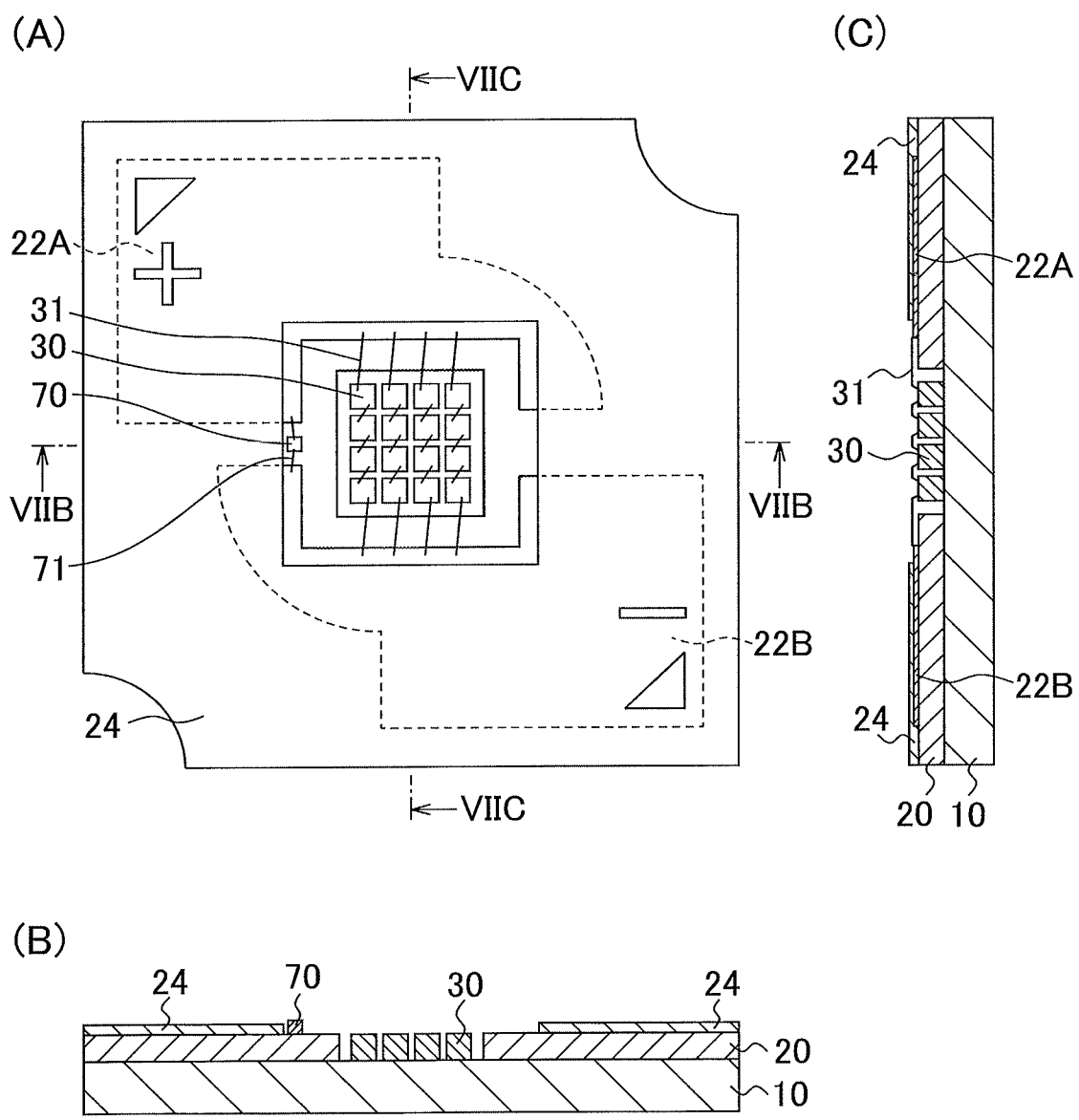
FIGS. 7(A) to (C) are a top view and cross-sectional views depicting a manufacturing step of the light-emitting device 1.
Figure 8:
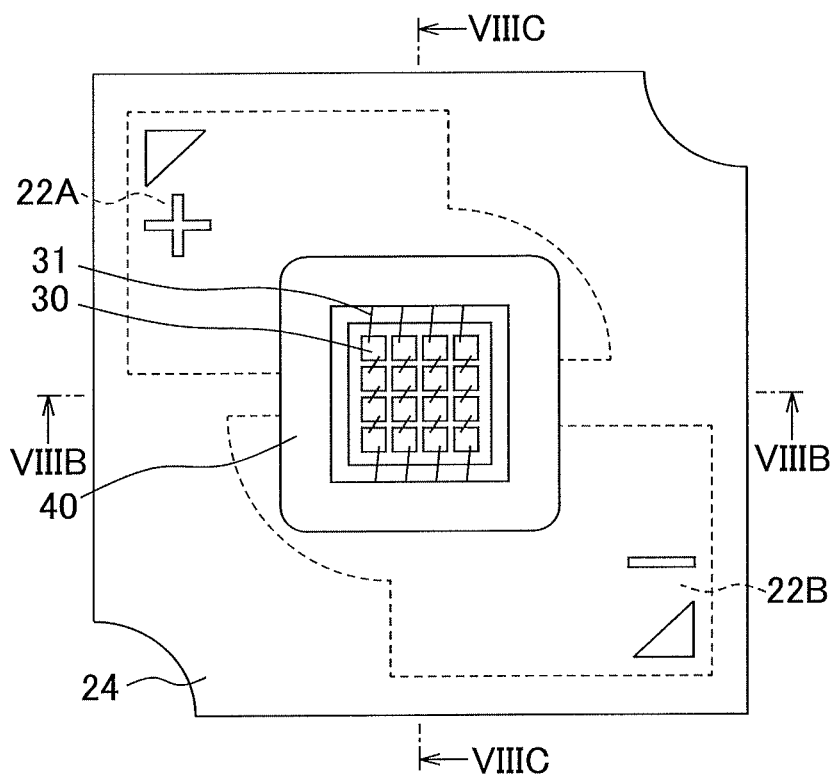
FIGS. 8(A) to (C) are a top view and cross-sectional views depicting a manufacturing step of the light-emitting device 1.
Figure 8:
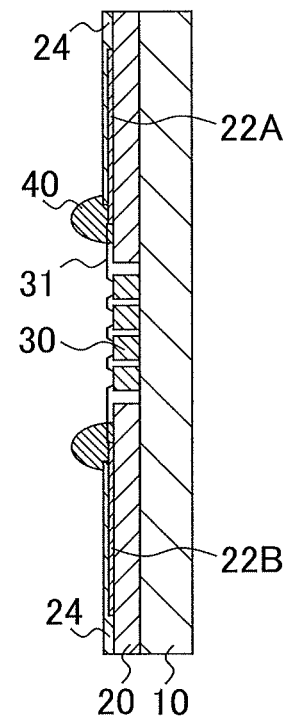
Figure 8:
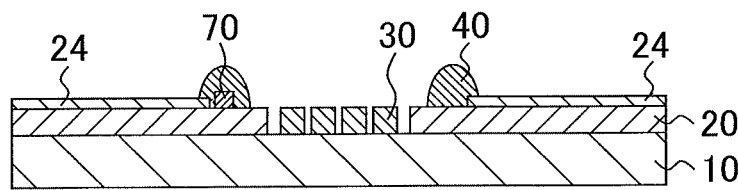

The Zener diode 70 is provided on the circuit board 20 in order to prevent the LED elements 30 from being broken owing to, for example, static electricity. The Zener diode 70 is connected to the conductive patterns 22A and 22B in parallel with the LED elements 30 (See FIG. 7(A) described later), and protects the LED elements 30 by bypassing electrical current caused by voltage inversely applied to the LED elements 30.

Figure 2:
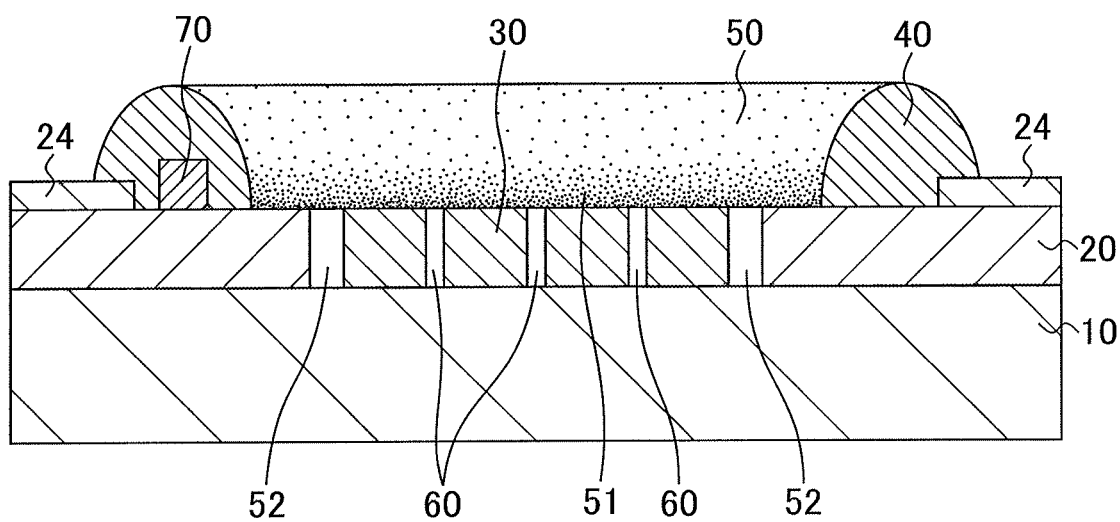
FIG. 2 is an enlarged cross-sectional view of the light-emitting device 1.

FIG. 2 is an enlarged cross-sectional view of the light-emitting device 1. FIG. 2 depicts an enlarged region near the LED elements 30 in FIG. 1(B). FIG. 2 also depicts the phosphor 51 contained in the seal resin 50. In the light-emitting device 1, the transparent resin 60 fills the space among the plurality of LED elements 30, and thereby the phosphor 51 is prevented from invading the space among the LED elements 30 and remains above the upper surfaces thereof. Although FIG. 2 illustrates the phosphor 51 settled just above the LED elements 30 and the transparent resin 60, the phosphor 51 may be uniformly dispersed in the seal resin 50.

If the transparent resin 60 were absent, allowing the seal resin 50 to fill the space among the LED elements 30 which are blue LEDs, and the phosphor 51 to invade the space, light emitted from the side surfaces of the LED elements 30 would exit outwardly from the light-emitting device after traveling a longer path in the layer of the phosphor 51 which is a yellow phosphor, than light emitted from the upper surfaces thereof, resulting in a stronger intensity of the yellow light. In other words, the intensity of the yellow light varies depending on the position and direction of the emission from the LED elements 30, resulting in a deviation of the hue of the emitted light from its designed hue value.

However, in the light-emitting device 1, since the presence of the transparent resin 60 prevents the phosphor 51 from invading the space among the LED elements 30, even light emitted laterally from the LED elements 30 does not undergo change in its hue until it reaches a level higher than the upper surfaces of the LED elements 30 after passing through the space among the elements. Therefore, light emitted from the side surfaces of the LED element 30 and that from the upper surfaces thereof travel the same distance in the layer of phosphor 51 above the upper surfaces of the LED elements 30 before they are emitted outwardly from the light-emitting device 1. In other words, in the light-emitting device 1, the distance in the phosphor layer which is traveled by emitted light is kept constant regardless of the position and direction of emission from the LED elements 30. Therefore, in the light-emitting device 1, light emitted laterally from the LED elements 30 is not an origin of the variation of the hue, being unlikely to cause a deviation of the actual hue of the emitted light from a desired hue thereof, and thereby resulting in emitted light with uniform chromaticity.

The transparent resin 60 may not necessarily fill the whole space from the lower to upper end of each LED element 30 among the LED elements 30, as long as the transparent resin 60 is placed among the elements so that the particulate phosphor 51 may be substantially prevented from invading the space among the LED elements 30. For example, some parts of the space may exist which are not filled with the transparent resin 60 owing to bubbles in the space formed by a blockade of the upper end of spaces among the LED elements 30 by the transparent resin 60.

FIG. 2 depicts the transparent resin filling a peripheral region 52 between the inner wall of the opening 21 and outermost LED elements 30 adjacent to the perimeter of the opening, and preventing the invasion of the phosphor 51. In order to eliminate the variation of the hue by making emitted light travel a constant distance in the phosphor layer, the peripheral region 52 is also preferably filled with the transparent resin 60. However, the peripheral region 52 may not be necessarily completely filled with the transparent resin 60, as long as the phosphor 51 is settled to be placed in such a way that the thickness of the phosphor 51 in the peripheral region 52 is comparable to that on the upper side of the LED elements 30. Alternatively, the peripheral region 52 may be filled with a white resin which contains no phosphor, instead of the transparent resin 60.

Figure 3:
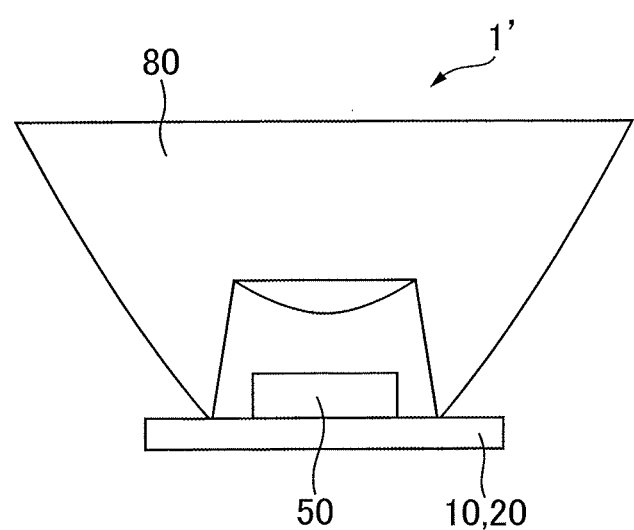
FIG. 3 is a side view of a light-emitting device 1' with a lens 80 attached thereto.

FIG. 3 is a side view of a light-emitting device 1' with a lens 80 attached thereto. When the light-emitting device 1 is used as an illumination apparatus, it is provided with, as illustrated in FIG. 3, the lens 80 mounted on the upper surface of the circuit board 20 so as to cover, for example, the seal resin 50. The lens 80 is an example of the optical element, which condenses light emitted from the plurality of LED elements 30 in the light-emitting device 1 and emits the light in an upward direction from the light-emitting device 1'. In order to facilitate mounting the lens 80, the area of the region not covered with the seal resin 50 on the circuit board 20 may be widened to secure a flat region to be surmounted by the lens 80. Since the light-emitting device 1 allows a plurality of LED elements 30 to be mounted densely, thereby enabling narrowing an emission region (emission area) without decreasing the number of the elements, it can achieve effective injection of the emitted light from the LED elements 30 into the lens 80.

Depending on applications of the light-emitting device 1, an optical element other than the lens 80, such as a filter, may be mounted on the circuit board 20. For example, a plate-like optical element instead of the lens 80 may be used, so that light from the LED elements 30 in the light-emitting device 1 is emitted therethrough.

Figure 4:
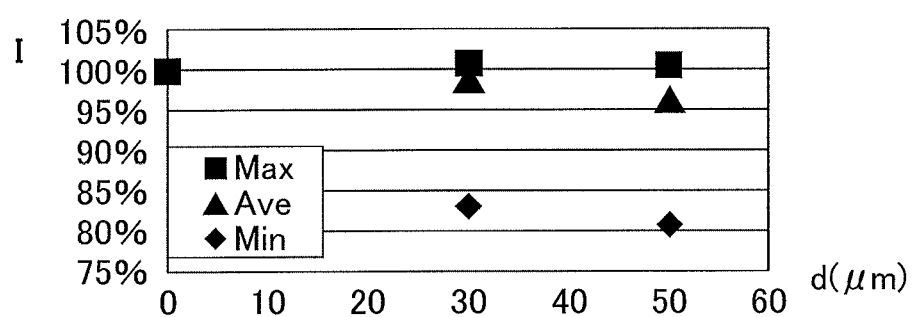
FIG. 4 is a graph indicating a relation between the mount space among the LED elements 30 and the illuminance of the light-emitting device 1'.

FIG. 4 is a graph indicating a relation between the mount space among the LED elements 30 and the illuminance of the light-emitting device 1'. The horizontal axis of the graph is a mount space d (μm) among the LED elements 30, and the vertical axis is a relative illuminance I with respect to the illuminance of emitted light from the light-emitting device 1' with the mount space d being 0 mm. Each LED element 30 is of a rectangular shape of 1 mm square and the incident edge of the lens 80 is of a circular shape of 10 mm in diameter. FIG. 4 indicates maximum values (Max), average values (Ave), and minimum values (Min) of the relative intensity I of the emitted light through the lens 80, with the mount space d being 30 μm and 50 μm. As indicated in FIG. 4, the minimum values of the relative intensity I for the mount spaces d of 30 μm and 50 μm are about 20% lower than that for the mount space d of 0 μm owing to a variation caused by the incorporation of the lens 80. However, the maximum values of the relative intensity I and the average values thereof are almost constant regardless of the mount spaces d in the illustrated range.

A narrower mount space d among the LED elements 30 is preferable because it leads to a smaller emission point for condensing light by using the lens 80. However, the mount space d is desirably secured to be, for example, at least about 5 μm so that no short occurs across adjacent LED elements 30. Further, a too large mount space d causes a larger emission diameter of the plurality of LED elements 30 relative to the diameter of the incident edge of the lens 80, leading to light loss, which results in the decrease of the illuminance of light emitted from the light-emitting device 1'. For example, when the lens 80 used for the measurement illustrated in FIG. 4 is used, the upper limit of the mount space d is preferably about 50 μm. Still further, when the mount space d is about 50 μm or less, it facilitates the step of filling the space among the LED elements 30 with the transparent resin 60 when the light-emitting device 1 is manufactured. Therefore, the plurality of LED elements 30 are preferably mounted densely on the mount board 10 so that the space between adjacent LED elements 30 may be 5 μm or more and 50 μm or less.

However, the upper limit of the mount space d among the LED elements 30 can be increased up to about 200 μm by changing the size and shape of the lens 80, for example, by using a lens larger than the lens 80 used for the measurement illustrated in FIG. 4. Therefore, the mount space between adjacent LED elements 30 may be 5 μm or more and 200 μm or less.

FIG. 5(A) to FIG. 8(C) are top views and cross-sectional views depicting manufacturing steps of the light-emitting device 1. FIG. 5(B), FIG. 5(C), FIG. 6(B), FIG. 6(C), FIG. 7(B), FIG. 7(C), FIG. 8(B), and FIG. 8(C) depict cross-sections along the line VB-VB and the line VC-VC in FIG. 5(A), the line VIB-VIB and the line VIC-VIC in FIG. 6(A), the line VIIB-VIIB and the line VIIC-VIIC in FIG. 7(A), and the line VIIIB-VIIIB and the line VIIIC-VIIIC in FIG. 8(A), respectively.

When the light-emitting device 1 is manufactured, first, the mount board 10 and the circuit board 20 provided with the opening 21 are superimposed and bonded to each other, as depicted in FIG. 5(A) to FIG. 5(C). Then, the plurality of LED elements 30 are mounted at a space of 5 to 50 μm on the upper surface of the mount board 10 exposed within the opening 21 of the circuit board 20, as depicted in FIG. 6(A) to FIG. 6(C). At the same time, the Zener diode 70 is also mounted between the conductive patterns 22A and 22B on the upper surface of the circuit board 20. Then, adjacent LED elements 30 are connected electrically to each other with wires 31, and wires 31 led out of outermost LED elements 30 adjacent to the perimeter of the opening 21 are connected to the conductive patterns 22A and 22B, as depicted in FIG. 7(A) to FIG. 7(C). At the same time, the Zener diode 70 is also connected to the conductive patterns 22A and 22B with wires 71.

Then, the resin frame 40 is fixed to a region on the upper surface of the circuit board 20, the region neighboring and enclosing the perimeter of the opening 21, as depicted in FIG. 8(A) to FIG. 8(C). Then, the transparent resin 60 containing no phosphor is placed among the plurality of LED elements 30, and further the exposed parts of the LED elements 30 are covered with the seal resin 50 containing a phosphor, to seal all of the LED elements 30. The light-emitting device 1 illustrated in FIG. 1(A) to FIG. 1(C) is thus completed according to the above steps.

The transparent resin 60 is injected from the top into the space among the LED elements 30 after bonding the elements to the mount board 10 at a space of 5 to 50 μm from each other and curing an adhesive for die bonding, for example. Alternatively, the transparent resin 60 may be injected laterally into the space among the LED elements 30 mounted on the mount board 10 and made to invade the space with the aid of the capillary phenomenon so that the space among the LED elements 30 may be filled with the transparent resin 60. These methods enable filling, with the transparent resin 60, the space from the lower to upper end of each LED element 30 among the LED elements 30. In particular, when the capillary phenomenon is used, the mount space among the LED elements 30 is preferably about 50 μm or less.

Alternatively, the LED elements 30 may be placed on the mount board 10 at a relatively large space from each other, with an adhesive for die bonding intervening therebetween, which adhesive is then spilled out among the elements by reducing the space down to within the range from 5 to 50 μm before curing the adhesive, and thereby the space can be filled with the adhesive. In this case, the transparent resin 60 may not be injected separately into the space, and the adhesive (die bonding paste) for bonding the LED elements 30 to the mount board 10 corresponds to the first resin.

Alternatively, the transparent resin 60 which fills the space among the LED elements 30 may be, for example, a coating material which covers the upper surfaces of the LED elements 30 in order to protect the wires 31. In other words, the coating material may also be used as the transparent resin 60, in place of the transparent resin 60 injected separately into the space.

Figure 9:
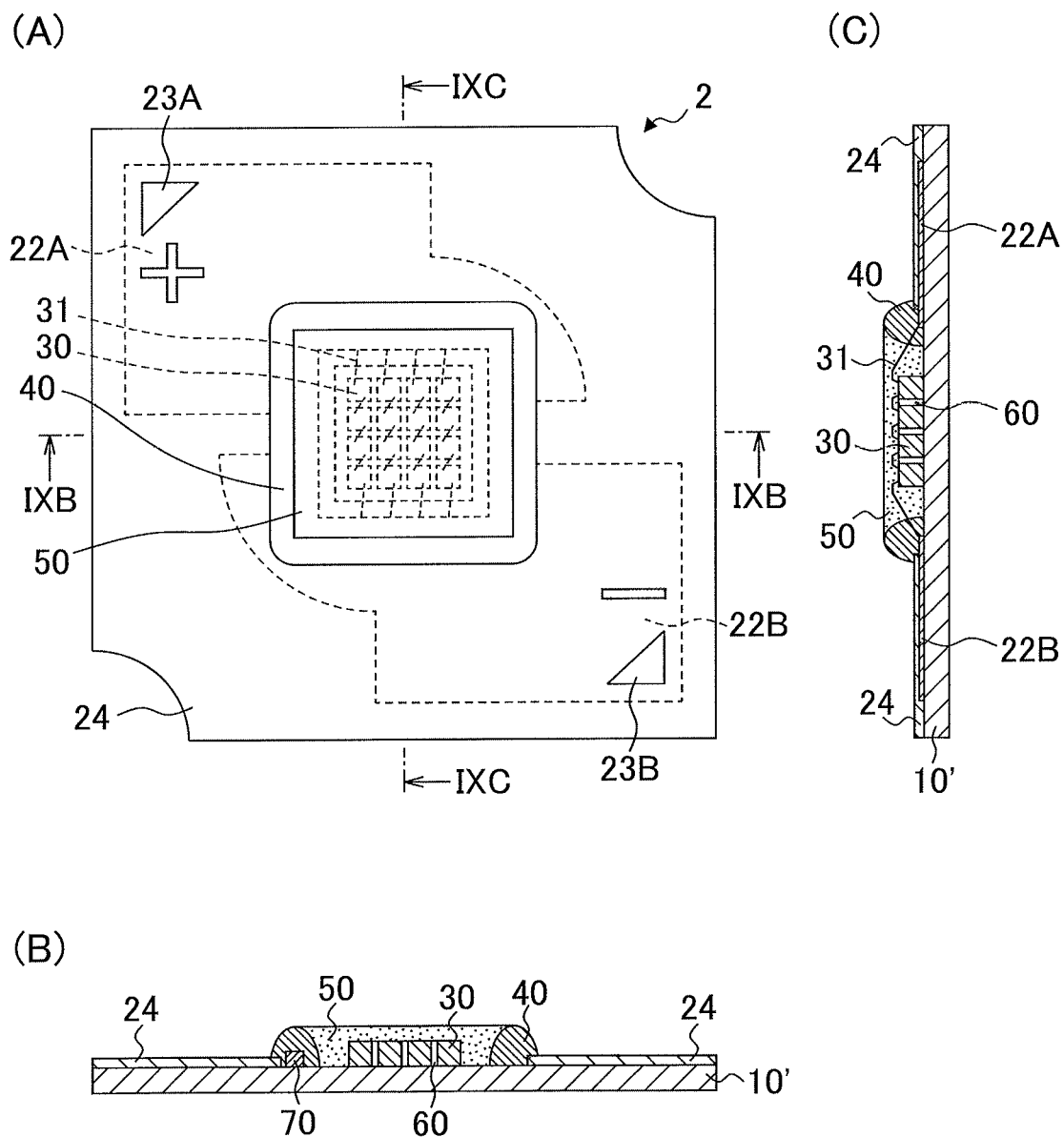
FIGS. 9(A) to (C) are a top view and cross-sectional views of a light-emitting device 2.

FIG. 9(A) to FIG. 9(C) are a top view and cross-sectional views of a light-emitting device 2. FIG. 9(A) is a top view of the light-emitting device 2 as a completed product, FIG. 9(B) is a cross-sectional view along the line IXB-IXB in FIG. 9(A), and FIG. 9(C) is a cross-sectional view along the line IXC-IXC in FIG. 9(A). The light-emitting device 2 is provided with a mount board 10', LED elements 30, a resin frame 40, a seal resin 50, a transparent resin 60, and a Zener diode 70 as major components. The light-emitting device 2 is different from the light-emitting device 1 in that it is not provided with the circuit board 20 which has an opening 21 and is included in the light-emitting device 1.

Figure 10:
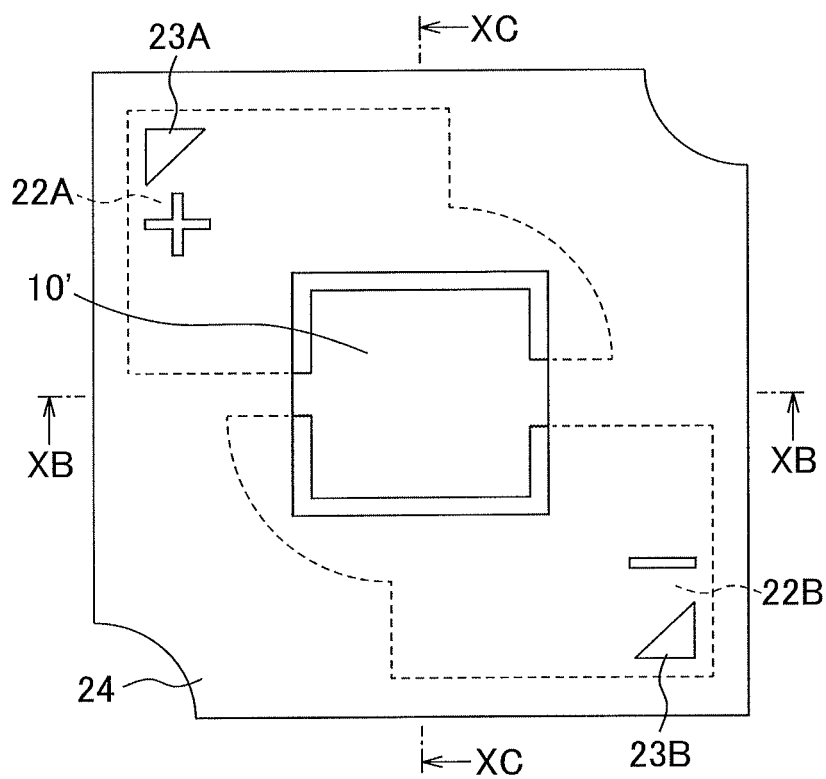
FIGS. 10(A) to (C) are a top view and cross-sectional views depicting a manufacturing step of the light-emitting device 2.
Figure 10:
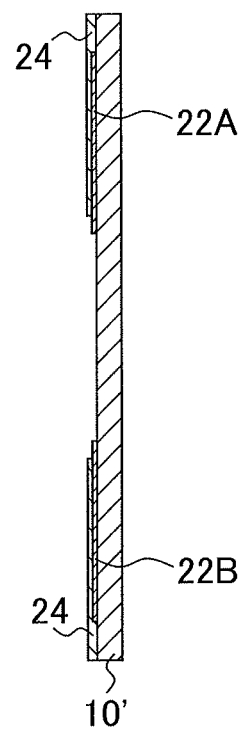
Figure 10:
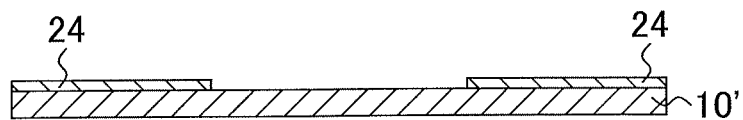
Figure 11:
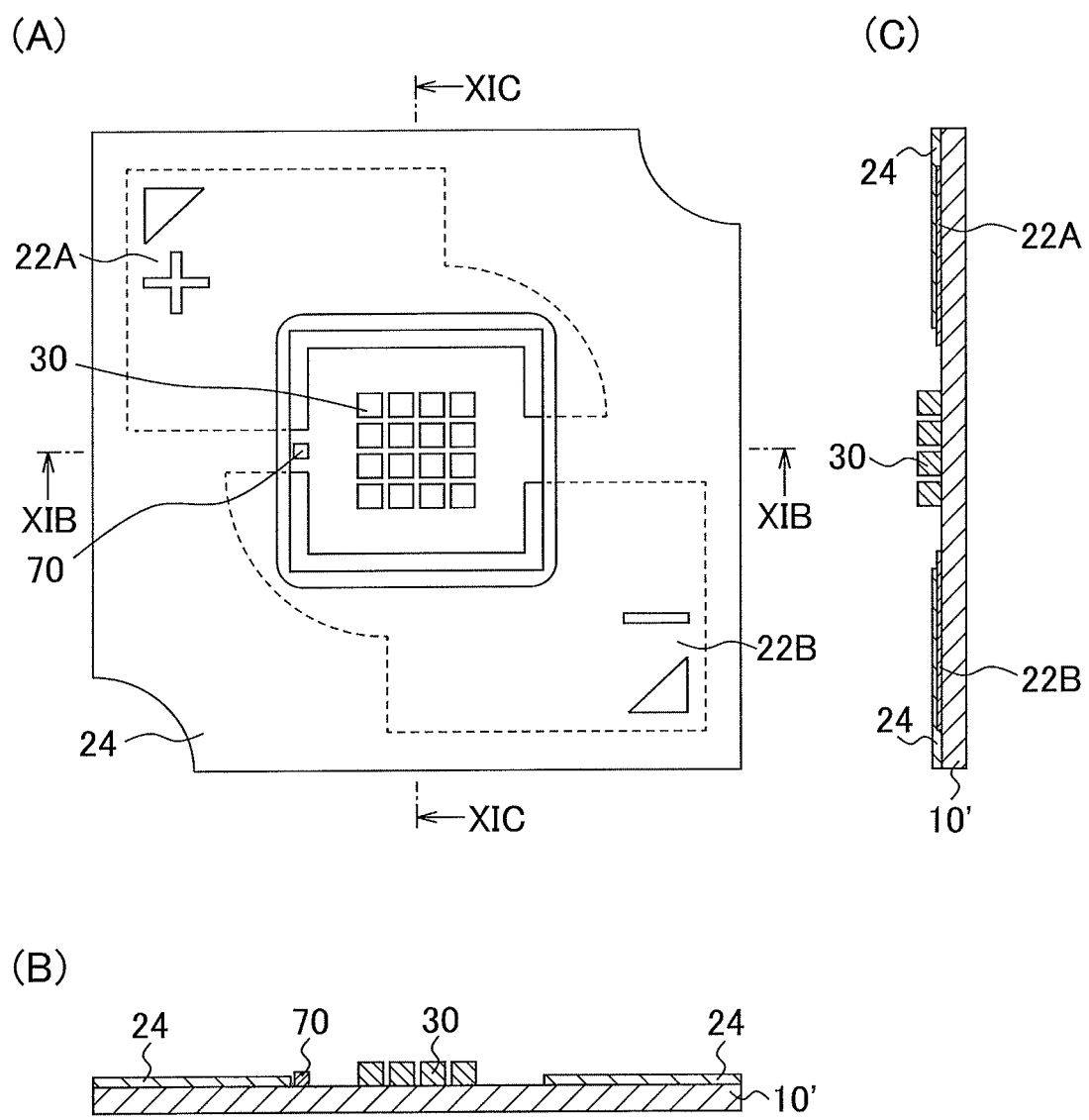
FIGS. 11(A) to (C) are a top view and cross-sectional views depicting a manufacturing step of the light-emitting device 2.

The mount board 10' is, for example, an electrically insulative board composed of ceramic, and includes, in the central region of the upper surface thereof, a mount region on which the LED elements 30 are mounted. The light-emitting device 2 is also provided with a plurality of LED elements 30 mounted in a lattice-like arrangement in the central region of the mount board 10', as is the case with the light-emitting device 1. The mount board 10', as is the case with the circuit board 20 of the light-emitting device 1, is provided with a conductive pattern 22A for a '+' electrode and a conductive pattern 22B for a '−' electrode, which are formed on the upper surface thereof, and connection electrodes 23A and 23B which are formed at two corners located diagonally on the upper surface thereof. Further, the mount board 10' is provided with a white resist 24 which is formed on the upper surface thereof and covers the conductive patterns 22A and 22B except for the region on the surface neighboring and enclosing the perimeter of the mount region for the LED elements 30 and the regions on the connection electrodes 23A and 23B (See FIG. 10(A) described later).

The resin frame 40 is an almost rectangular frame body composed of, for example, a white resin and fitted to the size of the mount region of the mount board 10', as is the case with the light-emitting device 1. However, the resin frame 40 may be of another shape such as a circular shape. The seal resin 50 is injected into a region enclosed by the resin frame 40 on the mount board 10', to cover and protect (seal) all of the LED elements 30 together. The seal resin 50 is a thermally resistive resin, such as a silicone resin, in which a phosphor is mixed and dispersed, as is the case with the light-emitting device 1.

Figure 12:
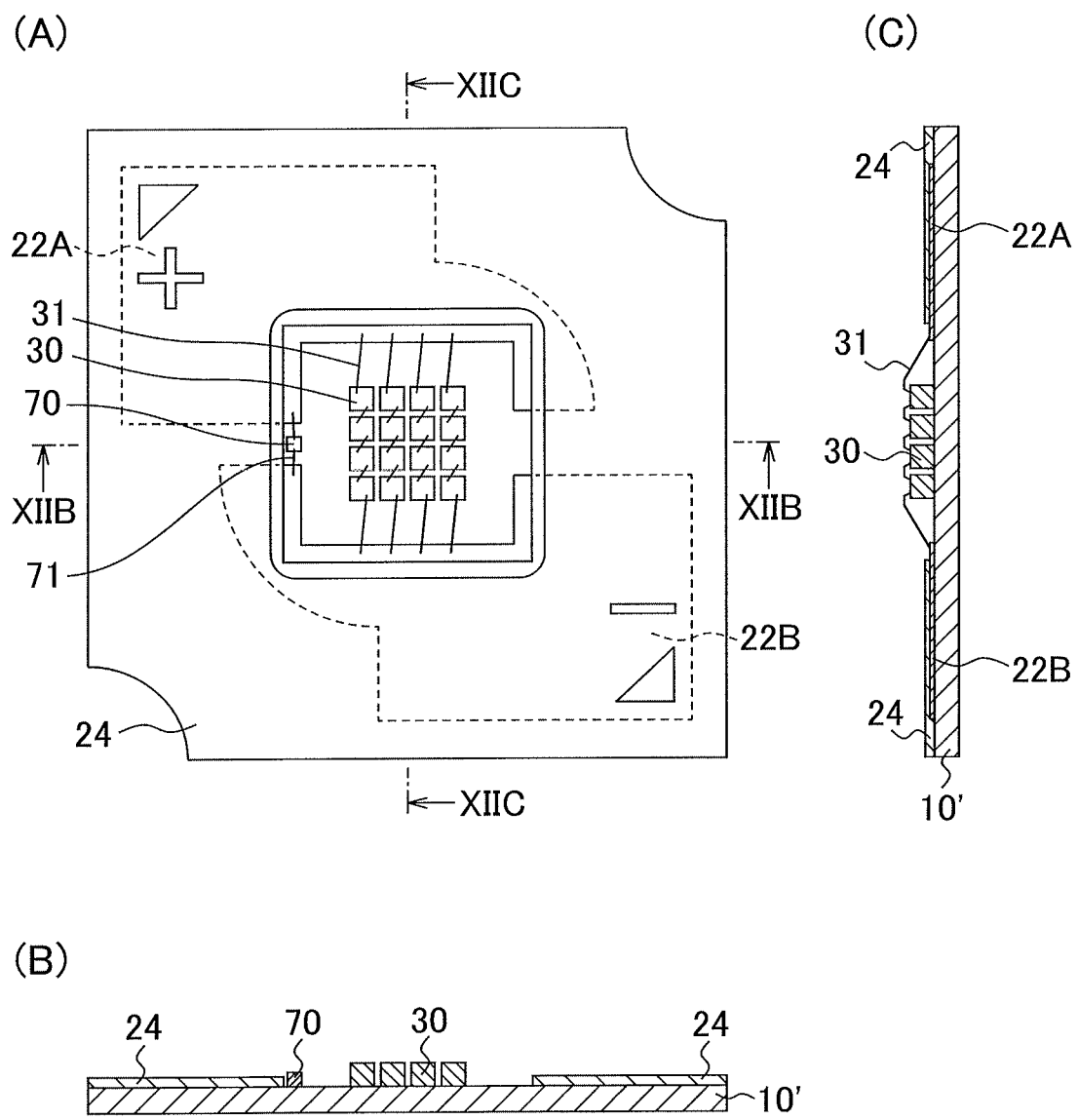
FIGS. 12(A) to (C) are a top view and cross-sectional views depicting a manufacturing step of the light-emitting device 2.
Figure 13:
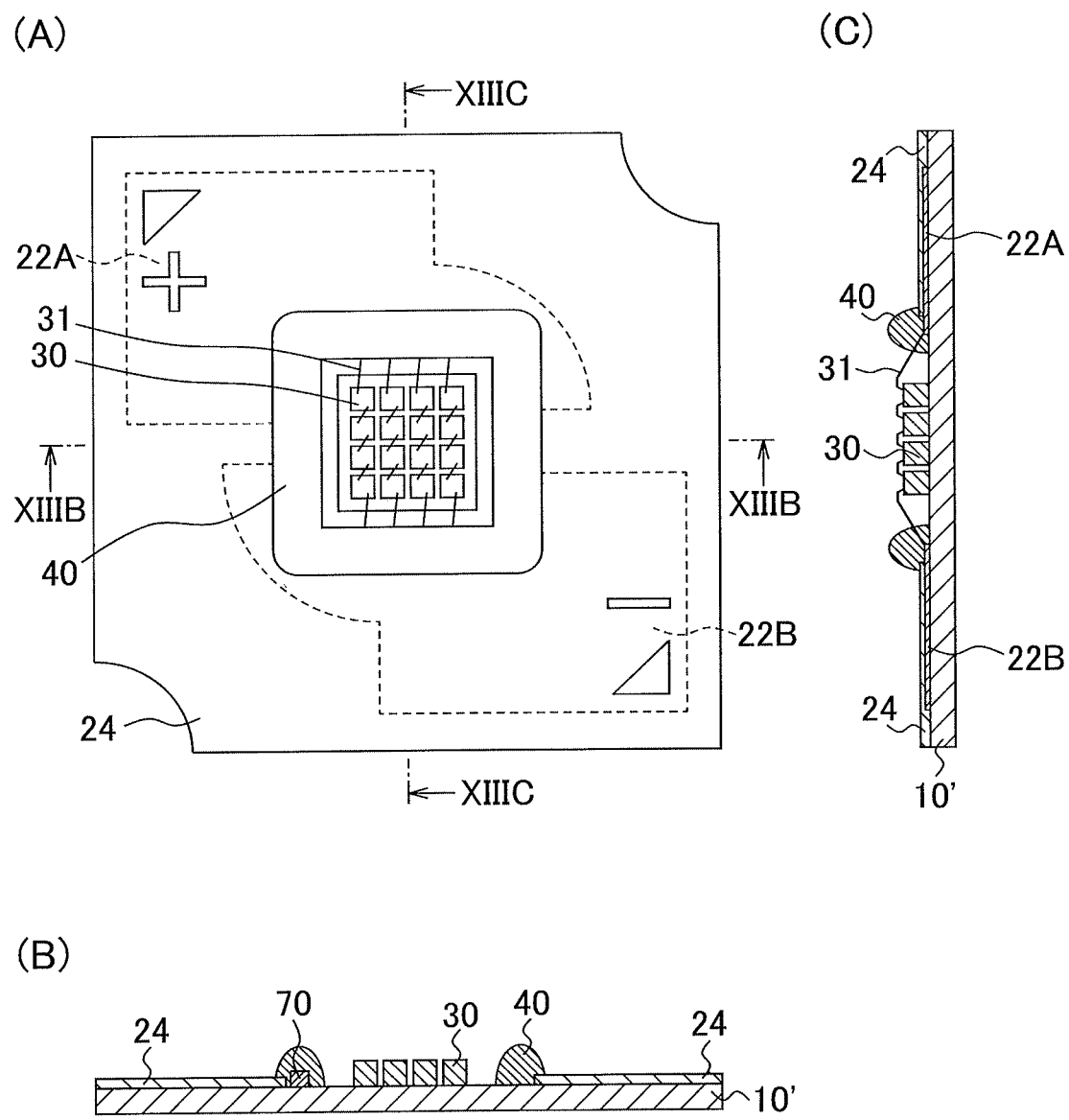
FIGS. 13(A) to (C) are a top view and cross-sectional views depicting a manufacturing step of the light-emitting device 2.

The transparent resin 60 is a colorless and transparent resin, such as silicone and epoxy resins, which contains no phosphor, as is the case with the light-emitting device 1. The transparent resin 60 is injected into the space among the LED elements 30 before the seal resin 50 is injected, and fills the space among the LED elements 30 so that the phosphor may not invade the space. The Zener diode 70 is connected to the conductive patterns 22A and 22B in parallel with the LED elements 30 on the mount board 10' (See FIG. 12(A) described later), and protects the LED elements 30 by bypassing electrical current caused by voltage inversely applied to the LED elements 30.

Also in the light-emitting device 2, since the presence of the transparent resin 60 prevents the phosphor in the seal resin 50 from invading the space among the LED elements 30, the distance in the phosphor layer which is traveled by emitted light is kept constant regardless of the position and direction of emission from the LED elements 30. Therefore, the light-emitting device 2 is also unlikely to cause a deviation of the actual hue of the emitted light from a desired hue thereof, and thereby resulting in emitted light with uniform chromaticity.

Also in the light-emitting device 2, the transparent resin 60 may not necessarily fill the whole space from the lower to upper end of each LED element 30 among the LED elements 30, as long as the particulate phosphor 51 is substantially prevented from invading the space among the LED elements 30.

Also in the light-emitting device 2, the transparent resin 60 or the white resin is preferably filled in the peripheral region between the resin frame 40 and outermost LED elements 30 adjacent to the perimeter of the opening. However, the peripheral region may not be necessarily completely filled with the transparent resin 60 or the white resin, as long as the phosphor in the seal resin 50 is settled to be placed in such a way that the thickness of the phosphor in the peripheral region is comparable to that on the upper side of the LED elements 30.

The light-emitting device 2, as is the case with the light-emitting device 1', may be provided with an optical element such as a lens 80 mounted on the upper surface of the mount board 10' so as to cover the seal resin 50. Further, also in the light-emitting device 2, the plurality of LED elements 30 are preferably mounted densely on the mount board 10' so that the space between adjacent LED elements 30 may be 5 µm or more and 50 µm or less, or 5 µm or more and 200 µm or less, as is the case with the light-emitting device 1.

FIG. 10(A) to FIG. 13(C) are top views and cross-sectional views depicting manufacturing steps of the light-emitting device 2. FIG. 10(B), FIG. 10(C), FIG. 11(B), FIG. 11(C), FIG. 12(B), FIG. 12(C), FIG. 13(B), and FIG. 13(C) depict cross-sections along the line XB-XB and the line XC-XC in FIG. 10(A), the line XIB-XIB and the line XIC-XIC in FIG. 11(A), the line XIIB-XIIB and the line XIIC-XIIC in FIG. 12(A), and the line XIIIB-XIIIB and the line XIIIC-XIIIC in FIG. 13(A), respectively.

When the light-emitting device 2 is manufactured, first, the mount board 10' is prepared which is provided with the conductive patterns 22A and 22B, the connection electrodes 23A and 23B, and the white resist 24 formed thereon, as depicted in FIG. 10(A) to FIG. 10(C). Then, the plurality of LED elements 30 are mounted at a space of 5 to 50 µm from each other in the central region of the mount board 10', as depicted in FIG. 11(A) to FIG. 11(C). At the same time, the Zener diode 70 is also mounted between the conductive pattern 22A and the conductive pattern 22B on the upper surface of the mount board 10'. Then, adjacent LED elements 30 are connected electrically to each other with wires 31, and wires 31 led out of outermost LED elements 30 adjacent to the perimeter of the mount region are connected to the conductive patterns 22A and 22B, as depicted in FIG. 12(A) to FIG. 12(C). At the same time, the Zener diode 70 is also connected to the conductive patterns 22A and 22B with wires 71.

Then, the resin frame 40 is fixed to the peripheral part of the mount region on the mount board 10', as depicted in FIG. 13(A) to FIG. 13(C). Then, the transparent resin 60 containing no phosphor is placed among the plurality of LED elements 30, and further the exposed parts of the LED elements 30 are covered with the seal resin 50 containing a phosphor, to seal all of the LED elements 30. The light-emitting device 2 illustrated in FIG. 9(A) to FIG. 9(C) is thus completed according to the above steps.

The transparent resin 60 in the light-emitting devices 1 and 2 may be a white resin. In other words, even the white resin containing no phosphor is used as the first resin, it is unlikely to cause a deviation of the actual hue of the emitted light from a desired hue thereof, and thereby resulting in emitted light with uniform chromaticity, as is the case with the light-emitting devices 1 and 2.

The LED elements 30 are mounted by using wire bonding in the light-emitting devices 1 and 2, but the above configuration is also applicable to a light-emitting device in which LED elements are mounted by using flip chip. When a transparent resin is used to fill the space among the plurality of LED elements mounted densely on the mount board by using flip chip, a deviation of the actual hue of emitted light from a desired hue thereof is unlikely to occur, owing to preventing the phosphor in the seal resin from invading the space among the elements, resulting in emitted light with uniform chromaticity, as is the case with the light-emitting devices 1 and 2.

The invention claimed is:

1. A light-emitting device comprising:
    a board;
    a plurality of light-emitting elements mounted on a mount region of the board so that a space between adjacent light-emitting elements is 5 μm or more and 50 μm or less;
    a rectangular resin frame formed from a white resin around the mount region, wherein the board comprises a flat region surrounding the rectangular resin frame;
    a first resin free from any phosphor, injected into the space among the plurality of light-emitting elements and made to invade the space among the plurality of light-emitting elements with the aid of the capillary phenomenon so that the space among the plurality of light-emitting elements is filled with the first resin;
    a second resin containing a phosphor and covering an exposed part of the plurality of light-emitting elements; and
    a lens, the incident edge of which is of a circular shape of 10 mm or less in diameter, configured to condense light emitted from the plurality of light-emitting elements, the lens comprising a lower concave recessed from a bottom surface of the lens, the lens being mounted on the board with the bottom of the lens in contact with the flat region, and the second resin being placed within the lower concave, wherein there is a gap between the lens and the second resin in the lower concave.

2. A manufacturing method of a light-emitting device, comprising the steps of:
    mounting a plurality of light-emitting elements on a mount region of a board so that a space between adjacent light-emitting elements is 5 μm or more and 50 μm or less;
    forming a rectangular resin frame from a white resin around the mount region;
    injecting a first resin free from any phosphor into the space among the plurality of light-emitting elements and making the first resin to invade the space among the plurality of light-emitting elements with the aid of the capillary phenomenon so that the space among the plurality of light-emitting elements is filled with the first resin;
    covering, with a second resin containing a phosphor, an exposed part of the plurality of light-emitting elements; and
    mounting a lens, the incident edge of which is of a circular shape of 10 mm or less in diameter, on the board, the lens having a lower concave recessed from a bottom surface of the lens, wherein mounting the lens includes placing the second resin in the lower concave and mounting the bottom of the lens in contact with a flat region of the board surrounding the resin frame, wherein the lens is configured to condense light emitted from the plurality of light-emitting elements, wherein there is a gap between the lens and the second resin in the lower concave.

3. The manufacturing method according to claim 2, wherein
    the first resin is a resin for adhering the plurality of light-emitting elements to the board in the step of mounting, and
    in the step of injecting, the first resin is spilled out into a space among the plurality of light-emitting elements, to fill the space among the light-emitting elements with the first resin.

4. The manufacturing method according to claim 2, wherein in the step of injecting, the first resin is injected laterally into a space among the plurality of light-emitting elements mounted on the board, to fill the space among the plurality of light-emitting elements with the first resin.

* * * * *